US 6,737,884 B2

(12) United States Patent
Shigemasa et al.

(10) Patent No.: US 6,737,884 B2
(45) Date of Patent: May 18, 2004

(54) POWER-ON RESET CIRCUIT AND IC CARD

(75) Inventors: Haruhiko Shigemasa, Yamatokoriyama (JP); Yoshihiro Nakao, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/207,187

(22) Filed: Jul. 30, 2002

(65) Prior Publication Data

US 2003/0020525 A1 Jan. 30, 2003

(30) Foreign Application Priority Data

Jul. 30, 2001 (JP) ........................................ 2001-230490

(51) Int. Cl.[7] .................................................. H03L 7/00
(52) U.S. Cl. .......................................... 326/38; 327/143
(58) Field of Search ................................ 326/37, 38, 82; 327/142, 143

(56) References Cited

U.S. PATENT DOCUMENTS 5,652,836 A  * 7/1997 Park ............................... 714/55
5,936,443 A  * 8/1999 Yasuda et al. ............... 327/143
6,437,614 B1 * 8/2002 Chen ............................ 327/143
2002/0171462 A1 * 11/2002 Sekimoto et al. ........... 327/143
2003/0090296 A1 * 5/2003 Yoo ............................... 327/12

FOREIGN PATENT DOCUMENTS

| DE | 100 24 980 A1 | 11/2001 |
| JP | 10-78834 | 3/1998 |
| JP | 10-269327 | 10/1998 |

* cited by examiner

*Primary Examiner*—Don Le
(74) *Attorney, Agent, or Firm*—Birch, Stewart, Kolasch & Birch, LLP

(57) ABSTRACT

A power-on reset circuit includes a first reset circuit, a second reset circuit, and an NOR circuit. The first reset circuit detects VCC2V supplied to a logic section so as to produce a first reset signal RST1, and the second reset circuit detects REGIN voltage, which is an output voltage of a rectifying circuit that rectifies power voltage obtained from an external power supply source, so as to produce a second reset signal RST2. The NOR circuit outputs either the RST1 or the RST2 as a reset signal P-RST. The above arrangement can provide the power-on reset circuit which outputs a reliable and effective reset signal even in case where the rising of power obtained from the external power supply source varies.

18 Claims, 8 Drawing Sheets

POWER-ON RESET CIRCUIT AND IC CARD

FIELD OF THE INVENTION

The present invention relates to power-on reset circuit which is utilized for an IC card that obtains electric power from the external electric power supply source without contacting, for example, through electromagnetic waves.

BACKGROUND OF THE INVENTION

In recent years, an IC card with a semiconductor integrated circuit device is becoming widespread. The IC card has a capability of exchanging information between an external reader/writer apparatus and a semiconductor integrated circuit device mounted in the IC card. This makes it possible to store necessary information in an internal nonvolatile memory of the semiconductor integrated circuit device, and conversely, to read information from the nonvolatile memory. By utilizing such an IC card, it is possible to realize a variety of functions that a magnetic card has carried out conventionally.

With a resent advance in the technology for large packing densities, the IC card has included a nonvolatile memory with a larger capacity. Accordingly, a multi-purpose card having a plurality of applications included in one IC card is also becoming widespread.

Further, non-contact type IC card system for the IC card has been studied in which the supply of electric power without contacting as well as data communication are carried out, utilizing electromagnetic waves with carrier frequencies of the order of several MHz to several tens of MHz. In case of non-contact type communication by using the IC card, no terminals for contacting is necessary, and no damages are caused in a contacting part of such terminals. Therefore, the IC card has advantages such as decrease in maintenance cost and easy handling.

One of the significant features of the non-contact type IC card system is that it is possible to arrange a system capable of a speedy and easily operable information exchange processing. For example, non-contact type IC card serving as a ticket for taking transport facilities such as a train and a bus allows a person to go through the ticket gate only by ways of holding the non-contact type IC card over the ticket gate (hereinafter referred to as "holding process"), or making the non-contact type IC card touch to the ticket gate in a moment (hereinafter referred to as "touch-and-go process").

Thus, in such a non-contact type IC card system, considered are various manners for information exchange between an IC card and a reader/writer apparatus. Some examples are given as follows: (1) a way of holding the IC card over the reader/writer apparatus at a small distance within approximately several cm (holding process); (2) a way of inserting the IC card to a card holder set in the reader/writer apparatus (inserting process); and (3) a way of supplying voltage to the IC card at power-on in setting the IC card to the reader/writer apparatus.

These ways are different from each other in how to make the IC card close to the reader/writer apparatus. Accordingly, they are different from each other in a condition inside the IC card for producing a power supply voltage when supplying power by electromagnetic induction from the reader/writer apparatus to the IC card.

Further, electromagnetic induction makes it impossible to supply a large amount of electric power and causes variations in the amount of the power supply. Therefore, a power-on reset operation in starting the supply of power must be highly reliable.

The following will explain what kind of power-on reset or malfunction preventing circuit of a reset circuit is used in a conventional non-contact type IC card.

For example, Japanese Laid-Open Patent Publication No. 269327/1998 (Tokukaihei 10-269327) discloses a circuit configuration for carrying out the power-on reset with respect to the non-contact type IC card. In the technology described in the publication, the power of the logic circuit is shut off on the reset operation by detection of power supply voltage in an analog mode. This shut-off does not apply voltage to an input/output circuit to/from a microcomputer and a microcomputer circuit. The configuration will be described more specifically below.

FIG. 10 is a circuit diagram of an example of the circuit configuration. Voltage outputted from an antenna coil 51 is supplied to each circuits after supplied to REG-A 55 and REG-B 56 as regulator circuits, and VREF 57 as a reference voltage producing circuit. From the REG-A 55, voltage is supplied to a microcomputer 64 and an interface section thereof. Further, from the REG-B 56, voltage is supplied to a CLK reproducing circuit 53, a reset producing circuit 54, an MOD 66 as a modulation circuit, a DEMO 67 as a demodulation circuit, and (+) terminal of a comparator circuit 59.

The output from the VREF 57 as a reference voltage producing circuit is for the voltage supply to the REG-A 55 and the REG-B 56, and a switch 60 is provided on the path to the REG-A 55 to control a power rising sequence. Further, the output from the VREF 57 is connected to a (+) terminal of a comparator circuit 58 for controlling ON/OFF operation of the switch 60.

The output voltages of the REG-A 55 and the REG-B 56 may be at the same potential or at a different potential. However, it is preferable that the REG-A 55 and the REG-B 56 have the same circuit configuration as a regulator.

Here, as a result of comparison in power rising rate among an analog detecting section including a resistor 61 and a diode 62, the VREF 57, the REG-A 55, and the REG-B 56, the REG-A 55 and the REG-B 56 rises in a most slow rate among them. The analog detecting section rises in a fastest rate, and the VREF 57 rises in a secondly fastest rate. By taking advantage of the difference in power rising rate, the power rising is controlled as follows.

First, the comparator circuit 59 determines which output voltages of the REG-B 56 and the VREF 57 is larger. In usual operation, the output voltage of the REG-B 56 is larger than that of the VREF 57. However, the power rising rate of the REG-B 56 is relatively slow as described above. Therefore, at the moment when the non-contact type IC card is held over the reader/writer apparatus, the output voltage of the VREF 57 becomes larger than that of the REG-B 56.

In such a situation, since the magnitude of the power supply voltage supplied to the microcomputer 64 is not sufficient for its stable operation, the microcomputer 64 must be in a reset state. Therefore, the reset producing circuit 54 produces a reset signal in accordance with the result of the comparison in the comparator circuit 59. The reset signal is provided to the microcomputer 64 via a buffer circuit 69 D. Thus, the microcomputer 64 can operate, being released from a reset state, only when power supply voltage sufficient for a stable operation is supplied thereto.

However, the microcomputer 64 cannot always obtain intended signals from the outputs of buffer circuits 69A to 69D in unstable operations by the logic circuits such as the reset producing circuit 54. In other words, a reset releasing signal may be outputted to the microcomputer 64 in a low power supply voltage before the output of the REG-A 55 is provided to the microcomputer 64 In such a case, the voltage of other terminals becomes higher than that of the microcomputer 64, which results in damage and malfunction of elements in the microcomputer 64. Also, the same event may occur in a terminal for clock and a terminal for data.

To prevent such disadvantages, it is arranged in the configuration shown in FIG. 10 that the switch 60 is provided on the path over which reference voltage supplied to the REG-A 55 flows, and the switch 60 disconnects so as not to supply power to the microcomputer 64 during the period that an adequately large voltage for operation cannot be available. Further, the same power source as the microcomputer 64 is connected to the buffer circuits 69A to 69D so that the voltage larger than that of a power source terminal cannot be applied to other terminals of the microcomputer 64.

Still further, the switch 60 carries out switching operation in accordance with a logic produced by an AND circuit 63 so that malfunction may not occur during the period that logic circuits such as the reset producing circuit 54 keeps unstable operation. The AND circuit 63 outputs each AND of the outputs of the reset producing circuit 54, the comparator circuit 59, and the comparator circuit 58. Such an AND circuit 63 can be realized by a simple transistor logic, so that the AND circuit 63 ensures a stable operation even in a low power source voltage.

The comparator circuit 58 compares between the output of the VREF 57 and a forward voltage of the diode 62. Usually, a rising of a forward voltage, which is obtained from bias current, of the diode 62 is fast. Therefore, the comparator circuit 58 outputs a logic "L" to the AND circuit 63 until the output of the VREF 57 makes a rising. Consequently, the output from the AND circuit 63 allows the switch 60 to be connected to a GND side so that the REG-A55 cannot make a false rising.

Further, the comparator circuit 59 compares between the outputs of the REG-B 56 and the VREF 57. Usually, the rising of the VREF 57 is faster than that of the REG-B 56. Therefore, the comparator circuit 59 outputs a logic "L" to the AND circuit 63 until the output of the REG-B 56 makes a rising. Consequently, the output from the AND circuit 63 allows the switch 60 to be surely connected to a GND side until the output of REG-B 56 makes a rising.

Further, during the period that the reset signal is not a logic "H" sufficiently, the output of the reset producing circuit 54 is inputted to the AND circuit 63 in such a manner that the switch 60 is connected to the GND side.

As described above, after the analog detecting section which includes the register 61 and the diode 62 ensures succession of its operation to the VREF 57, the REG-A 55, and the REG-B 56, a reset release is carried out, so that no false operation occurs.

Meanwhile, in recent years, with an increasing demand for the non-contact type IC card system, a considered form for usage is the conventional contact type IC card including capabilities of the non-contact type IC card, and it is distinguished between the use of the non-contact type IC card and the use of the contact type IC card according to purposes. Accordingly, a combination card that capabilities of non-contact type and contact type IC cards are integrated in one card can correspond to both systems of the non-contact type IC card system and the contact type IC card system, so that it is expected that the combination card will be popular in future.

Note that, the non-contact type IC card system has some types such as an adjacent type and a vicinity type according to its communication distance. Standardization of these types are promoted currently in ISO/IEC14443 and ISO/IEC10536.

As described above, there are various forms of the non-contact type IC card for usage, and a rising waveform of the voltage supplied from a non-contact type reader/writer apparatus varies depending on each situation in using such an IC card. This makes it difficult to detect voltages in the semiconductor integrated circuit device mounted in the IC card. That is, a condition setting of power-on-reset is highly difficult in a technical aspect, thereby making a design of the non-contact type reader/writer apparatus difficult.

Here, referring to FIGS. 11 and 12, the following will describe the rising waveform of the voltage supplied from the reader/writer apparatus and a reset period to be expected. In these drawings, a REGIN voltage is a voltage rectified by a bridge diode. In an example of the arrangement shown in FIG. 10, the REGIN voltage corresponds to the output from a diode bridge 52 to elements such as an REG-A 55. Further, a VCC2V voltage is a logic power supply of two volt produced from the REGIN voltage via a regulator. In the example of the arrangement shown in FIG. 10, the VCC2V voltage corresponds to the output voltage of REG-A 55

FIG. 11 shows a rising waveform of voltage by a switching operation of the reader/writer apparatus. The rising waveform of the REGIN voltage is sharp at this moment, and a rising period of the REGIN voltage is influenced by rectifying action of an antenna coil (an antenna coil 51 in FIG. 10), a diode bridge (a diode bridge 52 in FIG. 10), and a smoothing capacitor (a smoothing capacitor 68 in FIG. 10). In the present switching operation, the rising period of the REGIN voltage is set as a tREGIN period.

At this point, a rising period of a regulator that produces a logic voltage VCC2V is nearly equal to the rising period of the REGIN voltage. The VCC2V voltage rises with a little delay after the rising of the REGIN voltage, and its rising waveform is sharp. According to an actual measurement, the tREGIN period is in the order of several tens of $\mu$sec. In such a case of the rising waveform, a reset signal can be released after a required period for system initialization, setting a rising point of VCC2V voltage as an initial point.

FIG. 12 shows a rising waveform of voltage in the operations described previously, that is, in a holding operation, a inserting operation, or a touch-and-go operation. At this moment, the rising waveform of the REGIN voltage is gradual. According to the actual measurement, the tREGIN period, a rising period of the REGIN voltage, is in the order of several hundreds of msec. In such a case, the VCC2V voltage starts rising when the REGIN voltage reaches a set voltage level, although it depends on settings of the regulator. That is, in case where the rising waveform of the REGIN voltage is gradual, the VCC2V voltage reaches a target voltage before the REGIN voltage makes a complete rising.

In such a case of the rising waveform, the reset signal can be released at a rising point of the VCC2V voltage as an initial point. However, it is necessary to release the reset signal after the rising of the REGIN voltage as a main power supply, and an extremely long reset period is required as compared with the case shown in FIG. 11.

In the circuit shown in FIG. 10 as described previously, in case where the rising of the voltage is thus gradual, gate output of the AND 63 is unstable in the course of a transitional rising of the output from the REG-B 56 corresponding to the VCC2V voltage. This causes the malfunction of the switch 60, and as a result, there is a possibility that a reset release cannot be normally carried out.

Thus, a reset period varies between the case of a sharply rising voltage and the case of a gradually rising voltage, there is a problem that it is difficult to produce reset periods in the same reset circuit.

Further, in the IC card used in the conventional non-contact type IC card system, the available amount of a current by an LSI is not more than 10 mW. However, in a recent multi-purpose IC card, with the increasing number of applications stored in a nonvolatile memory, demand for an IC card with a large capacity is increasing. This increases the amount of a current required for the LSI to the order of about 200 mW. This arises a big problem in the non-contact type IC card system having a limited capability of power supply as described previously. Accordingly, a possibility rises that the lowering of power supply voltage is caused especially in writing/erasing to the non-volatile memory that consumes a large electric power. That is, the non-contact type IC card system has a problem that this change in the power supply voltage is falsely recognized as a rising of the power supply voltage. Therefore, it is necessary to give some contrivance to the reset circuit.

Further, the use of an A/D converter or a sophisticated analog detecting circuit for detection of power supply voltage must be avoided to prevent an additional increase in the amount of current consumed in the reset circuit. The use of such an arrangement results in not only the increase in the amount of a consumed current, but also the increase in the size of a circuit.

SUMMARY OF THE INVENTION

An object of the present invention is to provide a power-on reset circuit which outputs a reliable and effective reset signal even in case where the rising of electric power obtained from an external power supply source varies.

To achieve the above object, a power-on reset circuit according to the present invention, provided in a system in which a power voltage is obtained from an external power supply source without contacting by electromagnetic induction, a power voltage thus obtained is converted into a predetermined voltage and supplied to a logic section which performs a logic operation, produces a reset signal for controlling a reset state of the system. The power-on reset circuit includes:

a first reset circuit for detecting a voltage supplied to the logic section so as to produce a first reset signal;

a second reset circuit for detecting an output voltage of a rectifying circuit which rectifies a power voltage thus obtained from the external power supply source so as to produce a second reset signal; and a reset signal outputting circuit for outputting as the reset signal either the first reset signal or the second reset signal.

In case where electric power is obtained from the external power supply source without contacting by electromagnetic induction, conditions for production of the power voltage varies depending on situations, for example, in cases of a sharply rising power voltage and a gradually rising power voltage.

In case where power voltage rises sharply, the output voltage of the rectifying circuit also rises sharply, and thereafter, the voltage supplied to the logic section rises sharply. In such a case, if it is checked that the voltage supplied to the logic section has rose, this means that the output voltage of the rectifying circuit also rises. Therefore, the reset signal outputting circuit can output as a reset signal the first reset signal from the first reset circuit which detects the voltage supplied to the logic section.

On the other hand, in case where power voltage rises gradually, the output voltage of the rectifying circuit and the voltage supplied to the logic section also rises gradually. Here, the completely rising output voltage of the rectifying circuit is higher than the completely rising voltage supplied to the logic section, so that the rising of the voltage supplied to the logic section is completed more quickly in case where the power voltage rises gradually. Therefore, the reset signal outputting circuit can output as a reset signal the second reset signal from the second reset circuit which detects the output voltage of the rectifying circuit.

Thus, according to the above arrangement, it is possible to provide the power-on reset circuit which can surely control the reset state of the system in either case of a sharply rising power voltage and a gradually rising power voltage.

Further, the IC apparatus according to the present invention includes the above power-on reset circuit.

Application of the above power-on reset circuit to, for example, an IC apparatus like as an IC card can surely control the reset operation with respect to various functional blocks inside the IC apparatus, for example, even in a non-contact type IC apparatus making unstable power supply from the external power supply source. Therefore, it is possible to realize that IC apparatus which secures the stable operation.

Further, it is also possible to realize the IC card used as both non-contact type card and contact type card by providing contact type terminals to the above non-contact type IC card.

For a fuller understanding of the nature and advantages of the invention, reference should be made to the ensuing detailed description taken in conjunction with the accompanying drawings.

DESCRIPTION OF THE EMBODIMENTS

Referring to drawings, one embodiment of the present invention will be described below.

Figure 5:
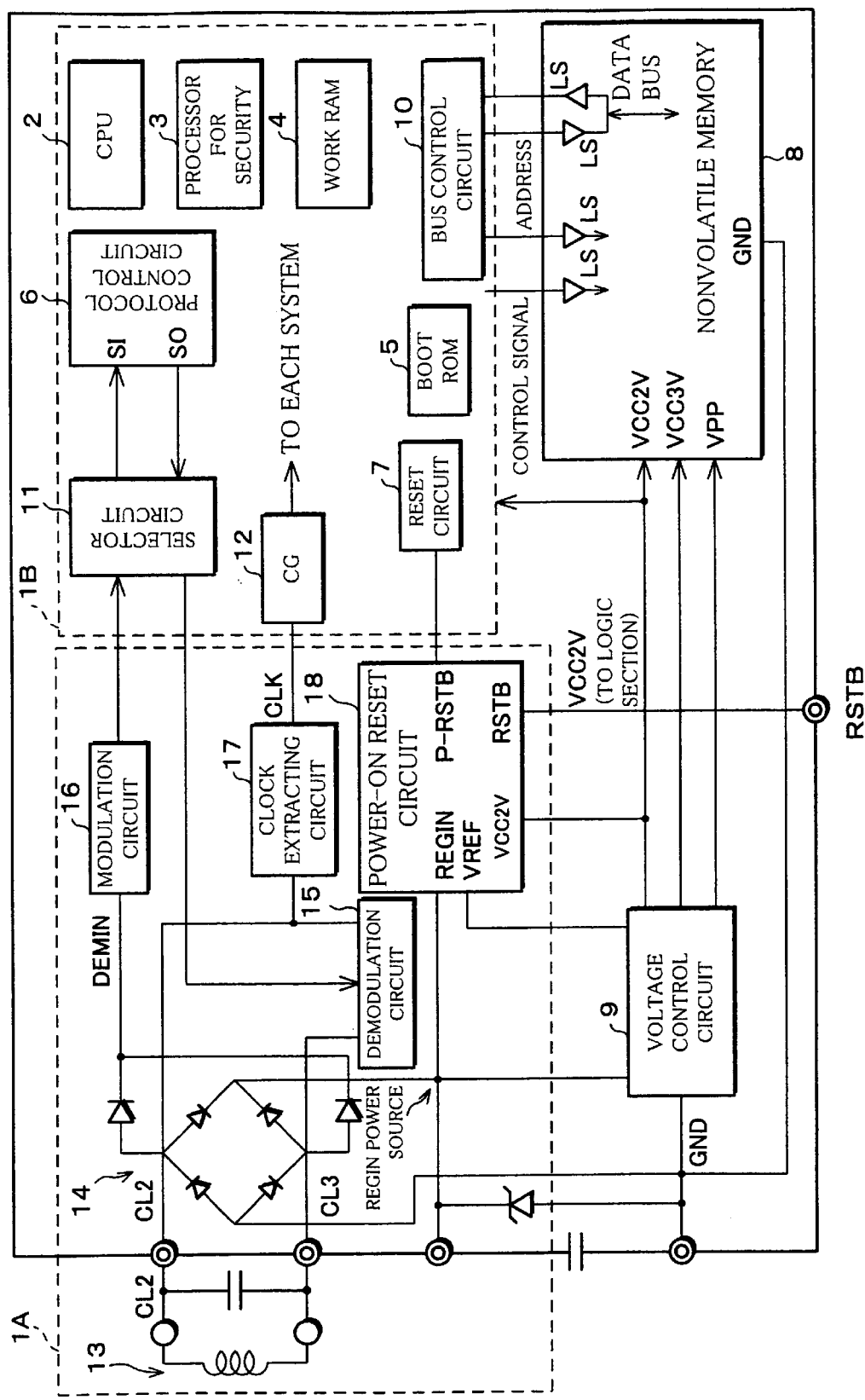
FIG. 5 is a block diagram schematically showing an arrangement of a semiconductor circuit device according to one embodiment of the present invention.

FIG. 5 is a block diagram schematically showing an arrangement of a semiconductor circuit device according to the present embodiment. The semiconductor circuit device is integrated in an IC card including both functions of contact type and non-contact type IC cards and adopts a power-on reset circuit.

The semiconductor circuit device generally includes an RF (Radio Frequency) section 1A (power obtaining section) which carries out communication using electromagnetic waves, a logic section 1B which includes a plurality of logic circuits performing various logical operations, a nonvolatile memory 8, and a voltage control circuit 9. The logic section 1B includes CPU (Central Processing Unit) 2 for data processing, a security processor 3 for performing a speedy encryption, a work RAM (Random Access Memory) 4 as a working region in an operating process, a boot ROM (Read Only Memory) 5 used on activation, a protocol control circuit 6, a reset circuit 7, CG (Clock Generator) 12, and a bus control circuit 10.

Further, the RF section 1A includes an antenna coil 13 for causing electromagnetic induction, a rectifying circuit 14 having connecting terminals of the antenna coil 13 and short key diodes, a modulation circuit 15, a demodulation circuit 16, a clock extracting circuit 17, and power-on reset circuit 18.

The feature of the semiconductor circuit device according to the present embodiment is inclusion of the power-on reset circuit 18 as described below and the nonvolatile memory 8 having a large-capacity memory such as a flash memory. The nonvolatile memory 8 includes, for example, flash EEPROM (Electrically Erasable/Programmable Read Only Memory). Data writing and reading with respect to the nonvolatile memory 8 is carried out by the bus control circuit 10 in the logic section 1B. Note that, the nonvolatile memory 8 is not limited to the flash EEPROM, and any nonvolatile memories such as FeRAM and MRAM may be adopted.

First, the following will describe the outline of operations in the above arrangement. An electric power produced by electromagnetic induction is rectified by the rectifying circuit 14. REGIN voltage source as a power supply voltage, to which full-wave rectification is carried out by the rectifying circuit 14, is inputted to the voltage control circuit 9. An optimum voltage for each block is produced in the voltage control circuit 9 to be supplied to each block. Further, waveforms of carrier waves from the rectifying circuit 14 are extracted by the clock extracting circuit 17 to produce clock signals.

Further, amplitude modulation is carried out by the modulation circuit 15 and the demodulation circuit 16 for data communication. The received signals are demodulated by the demodulation circuit 16. The demodulated signals are inputted via the selector circuit 11 to the protocol control circuit 6 and processed by the CPU 2. Further, transmitter signals produced by the CPU 2 are inputted via the selector circuit 11 from the protocol control circuit 6 to the modulation circuit 15. After the transmitter signals are converted into appropriate signals for transmission in the modulation circuit 15, the converted signals are transmitted from the antenna coil 13.

Note that, the IC card utilized in the present embodiment and the reader/writer apparatus corresponding to the IC card are defined to be based on type B standard of ISO/IEC14443. In addition, the RF section 1A receives carrier waves having a frequency of 13.56 MHz transmitted by the reader/writer apparatus, and the modulation circuit 15 and the demodulation circuit 16 modulate and demodulate data which are superposed by the carrier waves amplitude-modulated by 10% of ASK (Amplitude Shift Keying).

Secondly, the following will describe operations in each arrangement shown in FIG. 5. The carrier waves transmitted from the reader/writer apparatus are received by the antenna coil 13 as adapted to be optimal for feeding power. Electric power activated by the antenna coil 13 is rectified by the rectifying circuit 14 that includes short key barrier diodes.

Electrical signals produced in the rectifying circuit 14 are the following three signals: a CLK signal of 13.56 MHz extracted from the carrier waves in the clock extracting circuit 17; a data signal amplitude-modulated by 10% of ASK in the demodulation circuit 16; and power supply voltage (herein referred to as REGIN power voltage) to which full-wave rectification is carried out in the rectifying circuit 14.

As described above, there are various methods of approaching to the magnetic field of non-contact type IC card, and there are various ways of how a power voltage rises. Here, the following two cases will be described as typical cases.

Figure 11:
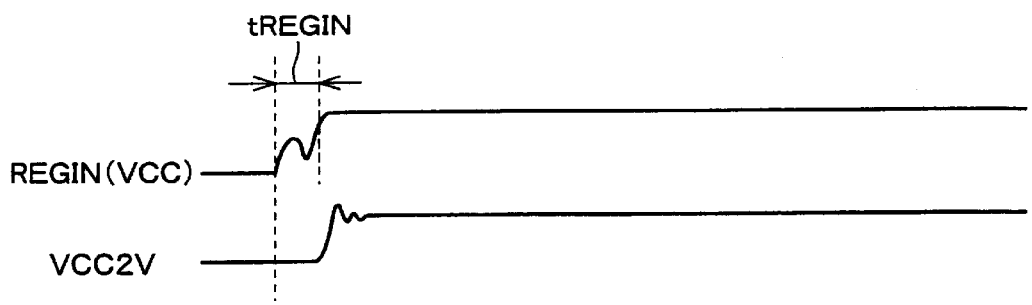
FIG. 11 is an explanatory view showing waveforms of the REGIN voltage and the VCC2V voltage in case where the REGIN voltage sharply rises.

One case assumes that voltage is supplied from the reader/writer apparatus to the IC card after the non-contact type IC card is set to the reader/writer apparatus. In such a case, the waveforms of the voltages of REGIN power (REGIN voltage) and the VCC2V voltage are such waveforms as shown in FIG. 11. In the case, the REGIN voltage rises in several tens of μsec after on-switch, and the rising waveform is sharp.

Note that, in case where voltage supply is thus carried out by the throwing of the switch, chattering may occur at the time of a voltage rising. It is therefore necessary to set a reset period in the consideration of the occurrence of the chattering.

As shown in FIG. 5, the VCC2V voltage is a power supply voltage which is supplied to the logic section 1B and the nonvolatile memory 8 as well as output of a regulator constituting the voltage control circuit 9. After the rising of REGIN voltage supplied from the rectifying circuit 14, reference voltage VREF is produced in a reference voltage producing circuit inside the voltage control circuit 9. Then, when the reference voltage VREF reaches an adequate voltage, the VCC2V voltage is produced from the regulator. This is why there occurs the time difference between the risings of the REGIN voltage and the VCC2V voltage in FIG. 11. Note that, the reference voltage VREF must be set to an optimum voltage value (for example, 1.5 V) among from a GND level to a power supply voltage level.

Figure 12:
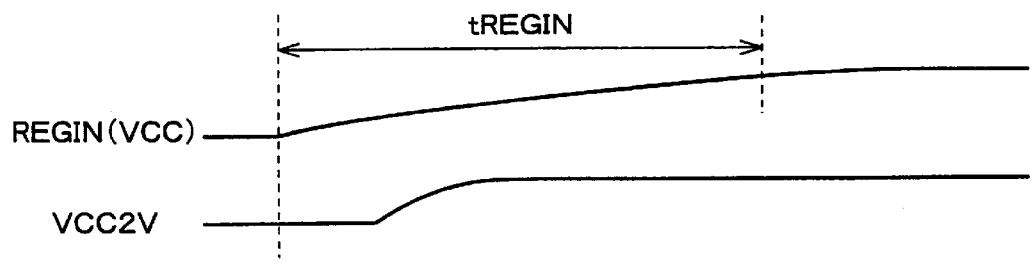
FIG. 12 is an explanatory view showing waveforms of the REGIN voltage and the VCC2V voltage in case where the REGIN voltage gradually rises.

Another case assumes that voltage is supplied from the reader/writer apparatus to the IC card by operations such as a holding operation, an inserting operation, and a touch-and-go operation. In such a case, the waveforms of the REGIN voltage and the VCC2V voltage are such waveforms as shown in FIG. 12. In the case, a rising period of the REGIN voltage is several hundreds of msec, and its rising waveform is gradual.

The power-on reset circuit 18 according to the present embodiment can securely output and release the reset signal in either case of power voltage rising as described above. Referring to the block diagram of FIG. 1, the power-on reset circuit 18 will be described in detail below.

The power-on reset circuit 18 includes a first reset circuit 21, a second reset circuit 22, an NOR circuit (reset signal outputting circuit) 23, an NAND circuit 24, and an inverter 25. With respect to the first reset circuit 21, the REGIN voltage, the VCC2V voltage, and the reference voltage VREF are supplied, and an RST1 signal (first reset signal) is outputted. With respect to the second reset circuit 22, the REGIN voltage and the reference voltage VREF are supplied, and an RST2 signal (second reset signal) is outputted.

The NOR circuit 23 outputs a result of a logical NOR operation with respect to the RST1 inputted from the first reset circuit 21 and the RST2 inputted from the second reset circuit 22. Further, the NAND circuit 24 outputs P-RSTB signal as a result of a logical NAND operation with respect to the input of the output from the NOR circuit 23 and the RSTB signal. The inverter 25 outputs a P-RST signal, which is an inverted version of the P-RSTB signal, as a power-on reset signal. Note that, the RSTB signal and the NAND circuit 24 will be described later.

In the above arrangement, the first reset circuit 21 detects the rising of the VCC2V voltage using the reference voltage VREF as a standard so as to output the RST1 signal. The second reset circuit 22 detects the rising of the REGIN voltage using the reference voltage VREF as a standard so as to output the RST2 signal. This realizes a reset circuit available for both cases: a sharply rising voltage and a gradually rising voltage. The first reset circuit 21 and the second reset circuit 22 will be described in detail below.

Figure 2:
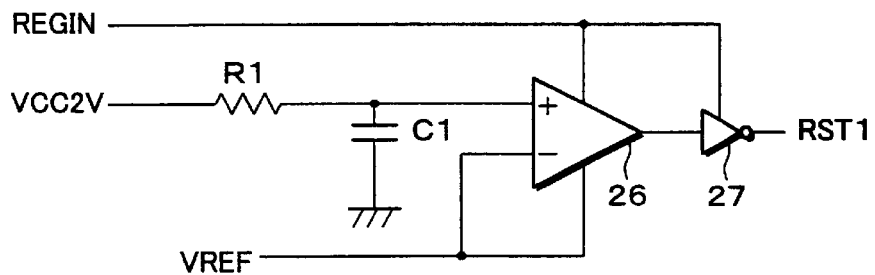
FIG. 2 is a block diagram schematically showing an arrangement of a first reset circuit which is provided in the power-on reset circuit.

First, referring to FIG. 2, the arrangement of the first reset circuit 21 will be described. The first reset circuit 21 includes a comparator circuit 26 of which the power supply voltage is REGIN voltage, and an inverter 27. The VCC2V voltage is inputted to the (+) terminal of the comparator circuit 26 via a series-parallel circuit that includes a resistor R1 and a capacity C1. Further, the reference voltage VREF is inputted to the (−) terminal of the comparator circuit 26. Such an arrangement makes the first reset circuit 21 detect and output the rising of the VCC2V voltage. Note that, the inverter 27 is provided for the determination of the polarity of the RST1 signal as a reset signal.

Here, output of the RST1 signal from the first reset circuit 21 is released after a delay of a time constant R1C1 by series-parallel circuit including the resistor R1 and the capacity C1 from a start of the output. Therefore, the time constant R1C1 is set so as to obtain the time for initialization of the system after the rising of the VCC2V voltage.

That is, the first reset circuit 21 is such a circuit as shown in FIG. 11 that makes a response in case where the rising of the REGIN voltage is sharp. This will be described below.

As described above, in case where the rising of the REGIN voltage is sharp, the rising of the reference voltage VREF is fast and substantially equal to that of the REGIN voltage. Such a reference voltage VREF is inputted to the (−) terminal of the comparator circuit 26. On the other hand, the rising of the VCC2V voltage is little behind from that of the REGIN voltage. Such a VCC2V voltage is inputted to the (+) terminal of the comparator circuit 26 after the delay of the time constant R1C1 by the series-parallel circuit. That is, provision of the delay time by the time constant R1C1 secures the reset period.

At the time of the rising of the REGIN voltage, the (−) terminal voltage of the comparator circuit 26 to which a speedily rising reference voltage VREF is inputted is higher than the (+) terminal voltage to which the VCC2V voltage of which rising is little behind. Therefore, the RST1 signal outputted via the inverter 27 becomes "H" level. Thereafter, the VCC2V voltage increases after the delay time of the time constant R1C1. Along with this increase, the (+) terminal voltage rises, and the RST1 signal becomes "L" level at the point that the (+) terminal voltage is larger than the (−) terminal voltage. Here, the period that the RST1 signal is in the "H" level is a reset period.

Figure 3:
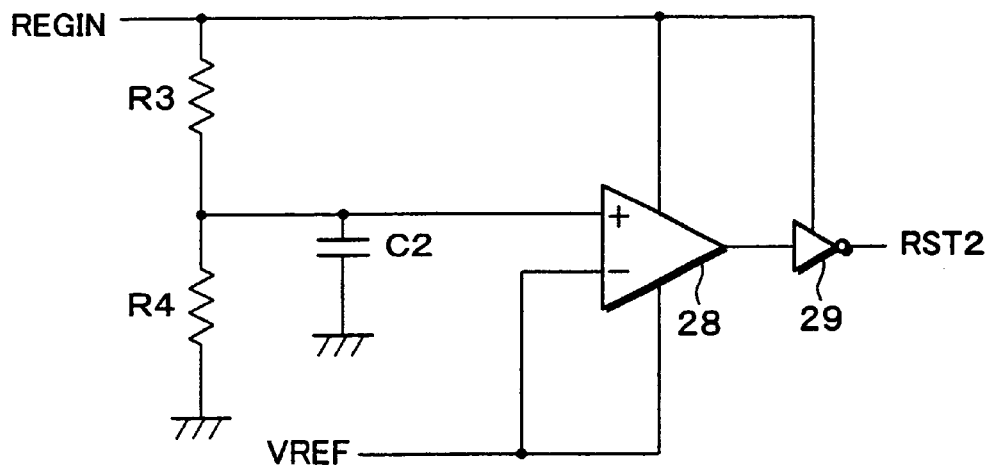
FIG. 3 is a block diagram schematically showing an arrangement of a second reset circuit which is provided in the power-on reset circuit.

Next, referring to FIG. 3, the arrangement of the second reset circuit 22 will be described. The second reset circuit 22 includes a comparator circuit 28 of which the power supply voltage is REGIN voltage, and an inverter 29. The REGIN voltage which is divided at the resistors R3 and R4 is inputted to the (+) terminal of the comparator circuit 28 via a capacity C2 connected in parallel. The reference voltage VREF is inputted to the (−) terminal of the comparator circuit 28. Such an arrangement makes the second reset circuit 22 detect the rising of the REGIN voltage and output a signal for reset release. Note that, the inverter 29 is provided for the determination of the polarity of the RST2 signal as a reset signal.

Here, the RST2 signal outputted from the second reset circuit 22 is outputted as a signal for releasing a reset state after the delay time of the time constant R4R3C2/(R4+R3) by the divided resistors R3 and R4 and a capacity C2 from the rising of the REGIN voltage. Therefore, the time constant R4R3C2/(R4+R3) is set so as to obtain the time for initialization of the system after the rising of the REGIN voltage.

That is, the second reset circuit 22 is such a circuit as shown in FIG. 12 that makes a response in case where the rising of the REGIN voltage is gradual. This will be described below.

As described above, in case where the rising of the REGIN voltage is gradual, the output of the reference voltage VREF follows the rising of the REGIN voltage. This is because the response of the reference voltage VREF is faster than the rising of the REGIN voltage.

In case where the reference voltage VREF reaches a predetermined voltage, the VCC2V voltage is outputted from the regulator outputting circuit inside the voltage control circuit 9.

The voltage divided at the resistors is inputted to the (+) terminal of the comparator circuit 28, so that the potential of the (+) terminal of the comparator circuit 28 is lower than that of the (−) terminal to which the reference voltage VREF is inputted. Therefore, the RST2 signal outputted via the inverter 29 becomes "H" level.

Thereafter, in case where the reference voltage VREF saturates, for example, at 1.5V, increase in the potential of the (+) terminal of the comparator circuit 28 continues, and the potential of the (+) terminal of the comparator circuit 28 exceeds that of the (−) terminal in the end. At this point, the RST2 signal is in the "L" level. Here, the input of the REGIN voltage is behind by the delay time of the time constant R4R3C2/(R4+R3). Therefore, the RST2 signal becomes "L" level after a lapse of the delay time starting from the rising of the REGIN voltage.

The power-on reset circuit 18 includes the first reset circuit 21 and the second reset circuit 22 that perform the above operations. The power-on reset signal P-RST is obtained by the respective results of the RST1 signal and the RST2 signal by OR operation. That is, the power-on reset circuit 18 makes it possible to output the power-on reset signal P-RST which is capable of setting a suitable reset period whether the REGIN voltage rises sharply or gradually.

Figure 6:
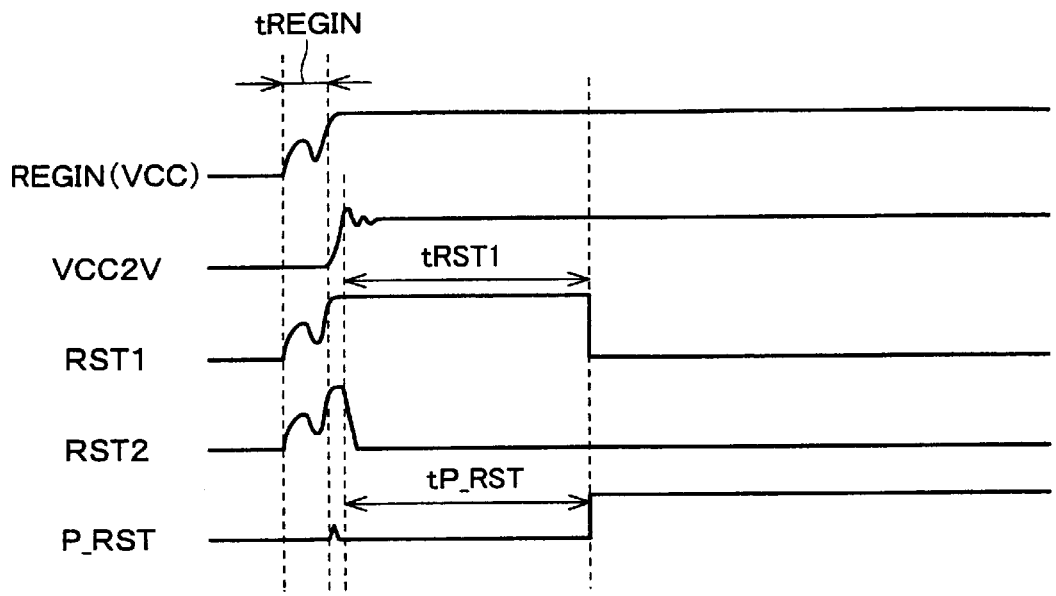
FIG. 6 is an explanatory view of waveforms showing operation of each signal in case of a sharply rising REGIN voltage.
Figure 7:
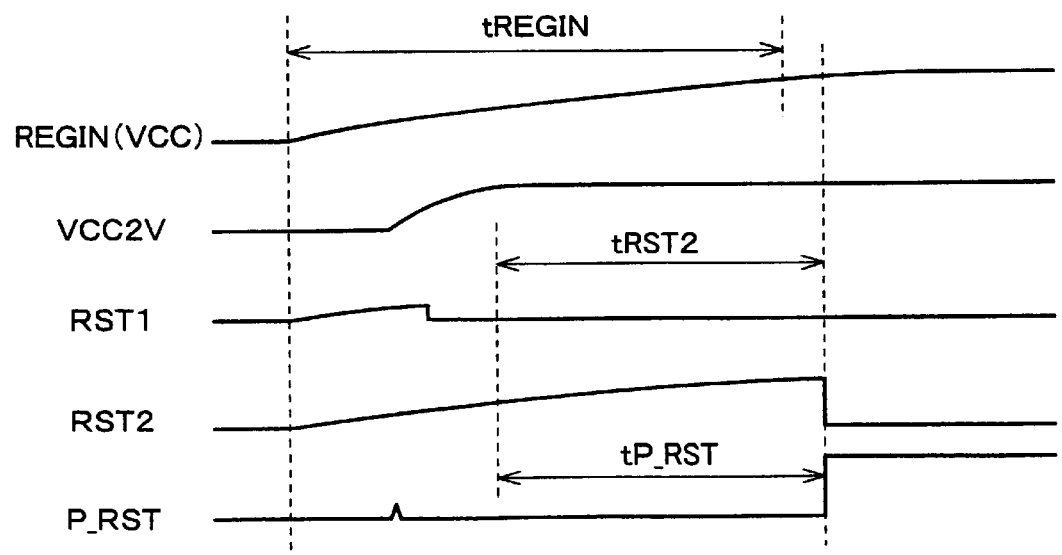
FIG. 7 is an explanatory view of waveforms showing operation of each signal in case of a gradually rising REGIN voltage.

Next, referring to FIGS. 6 and 7, the following will describe changes of each signal in the power-on reset circuit 18 in both cases of a sharply rising power source voltage and a gradually rising power source voltage.

In FIG. 6, a rising period tREGIN of the REGIN voltage is several μsec. That is, FIG. 6 shows the case of a sharply rising REGIN voltage. As described above, there is a time difference between the risings of the REGIN voltage and the VCC2V voltage because of operation by the regulator. On the other hand, the RST1 signal and the RST2 signal rise at the same timing of the rising of the REGIN voltage.

At first, the second reset circuit 22 detects the rising of the REGIN voltage, and the RST2 signal becomes "L" level. The sharper the rising of the REGIN voltage is, the faster the RST2 signal becomes "L" level. Note that, it is set in the present embodiment so that the RST2 signal becomes "L" level when the REGIN voltage rises about at 4.0 V.

Next, the RST1 signal becomes "L" level after a lapse of a reset period tRST1 which is determined by the delay time of the time constant R1C1 from the rising of the VCC2V voltage. At this point, the P-RST signal becomes "H", and reset release is carried out. Thus, in case of a sharply rising REGIN voltage, the first reset circuit 21 operates effectively.

In FIG. 7, a rising period tREGIN of the REGIN voltage is several hundreds of msec. That is, FIG. 7 shows the case where the REGIN voltage rises gradually. As described above, in accordance with the rising of the REGIN voltage, the reference voltage VREF rises in the same way. In case where the reference voltage VREF reaches a predetermined voltage, the VCC2V voltage starts to output. At this point, the first reset circuit 21 first detects the rising of the VCC2V voltage, and the RST1 signal is determined to be "L" level.

Next, the RST2 signal is outputted in the "H" level according to the rising of the REGIN voltage. When the second reset circuit 22 detects that the REGIN voltage reaches the predetermined voltage (for example, about 4.0V), the RST2 signal is changed to the "L" level after a lapse of the delay time of the time constant R4R3C2/(R4+R3). At this point, the P-RST signal becomes "H", and reset release is carried out. Thus, in case where the rising of the REGIN voltage is gradual, the second reset circuit 22 effectively operates.

Note that, in the present embodiment, with respect to the rising of the power supply voltage, the first reset circuit 21 and the second reset circuit 22 are designed in such a manner that the time range of their operation overlap each other for prevention of their malfunction. That is, it is designed in such a manner that the first reset circuit 21 operates in the range of the tREGIN period from several μsec to several msec, and the second reset circuit 22 operates in the range of the tREGIN period from several hundreds of μsec to several hundreds of msec. Switching of circuits is carried out in the tREGIN period of the range between several hundreds of μsec and several msec. In the range, both of the circuits operate; however, the second reset circuit 22 takes precedence over the first reset circuit 21.

Figure 1:
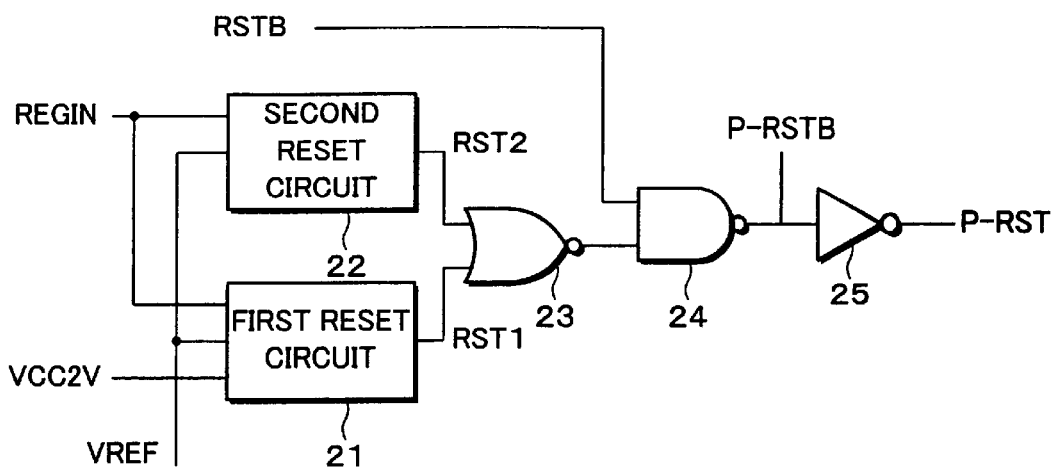
FIG. 1 is a block diagram schematically showing an arrangement of a power-on reset circuit which is provided in a semiconductor circuit device according to one embodiment of the present invention.

Next, the following will describe the RSTB signal supplied to the NAND circuit 24 in FIG. 1. The RSTB signal (a third reset signal) is a reset signal supplied from outside. The NAND circuit 24 becomes active in response to the input of the reset signal of a logic level "L". In case where the semiconductor circuit apparatus according to the present embodiment is used for a combination card that functions of the non-contact type IC card and the contact type IC card are integrated in one card, the RSTB signal corresponds to the reset signal that is inputted from an external terminal of contact type.

In the present embodiment, as is apparent from the arrangement shown in FIG. 1, it is set in such a manner that the RSTB signal as a reset signal from outside takes precedence over the RST1 signal and the RST2 signal. However, precedence with respect to these signals can be properly changed according to the specification of adopted IC cards. Change of the precedence can be possible by the change of the circuit corresponding to the NAND circuit 24.

Under the condition that the reset signal from outside is assigned the highest priority, in case where the IC card using the power-on reset circuit 18 of the present embodiment, reset operation in a quick response to the input of the reset signal from external terminals can exclude effects caused by electromagnetic waves in the periphery devices including the reader/writer apparatus.

Figure 4:
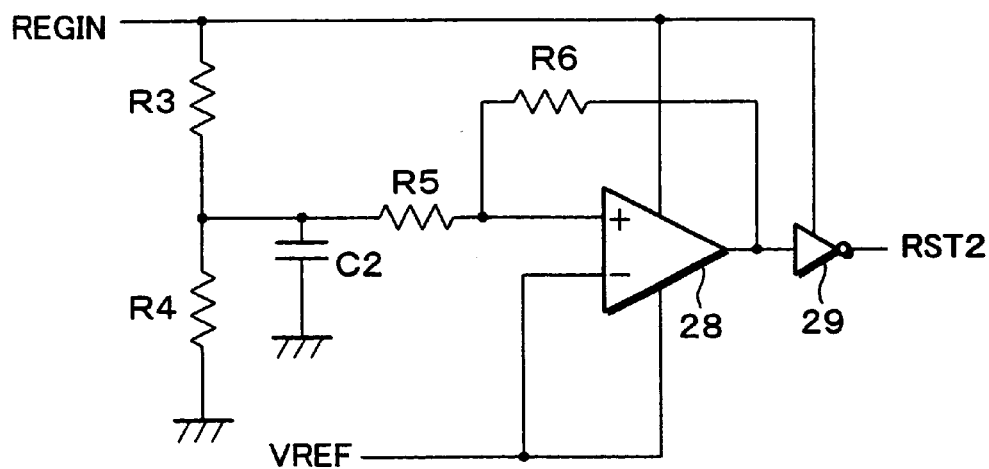
FIG. 4 is a block diagram schematically showing an arrangement of the second reset circuit in which a hysteresis comparator is applied.

Next, the following will describe measures against the increase in a consumed current, which has been given as a problem previously. In the non-contact type IC card system, a capacity of power supplied to the IC card is relatively small. In such a case, increase in a consumed current may decrease the level of power supply voltage. Therefore, means for preventing malfunction of the reset operation are also needed in case where writing or erasing operation which requires a large amount of electric power is carried out with respect to a large-capacity of nonvolatile memory provided in the non-contact type IC card, FIG. 4 shows an example of the arrangement of the second reset circuit 22 including such means for preventing malfunction of the reset signal. The second reset circuit 22 differs from an arrangement example of the second reset circuit 22 shown in FIG. 3 in that a resistor R5 is provided between divided resistors R3 and R4 or a capacity C2, and the positive feedback is carried out via the resistor R6 from the output terminal to the (+) terminal of the comparator circuit 28. Any other arrangement is the same except for the above difference. Such a circuit, which is called a hysteresis comparator, is useful for the provision of a hysteresis characteristic to the second reset circuit 22.

Figure 8A:
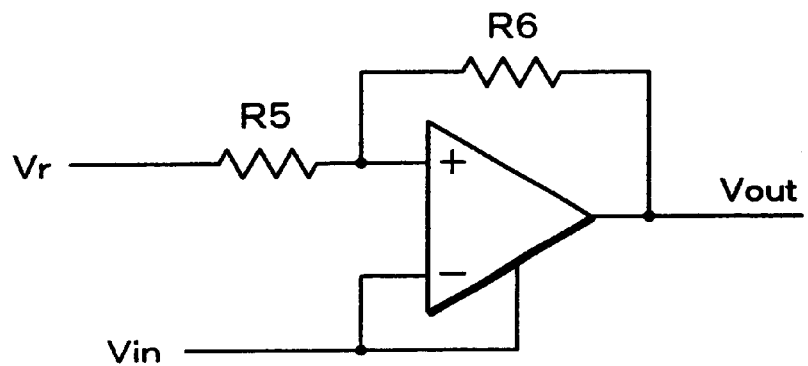
FIG. 8(a) is a circuit diagram schematically showing an arrangement of a hysteresis comparator.
Figure 8B:
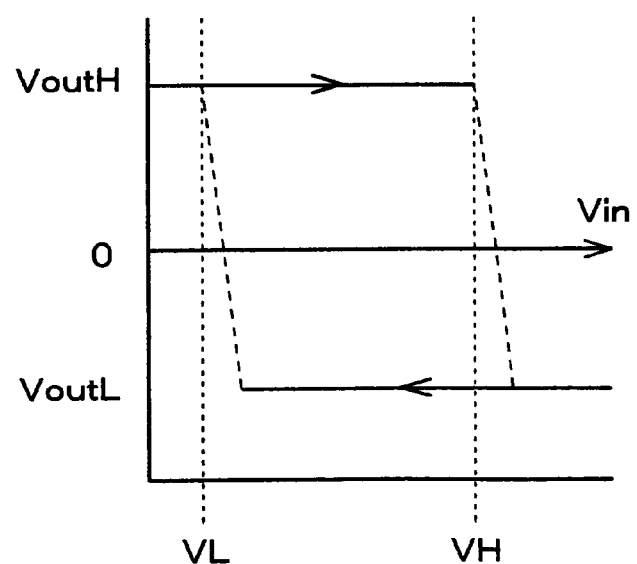
FIG. 8(b) is an explanatory view of a waveform showing operation of the hysteresis comparator.

FIG. 8(a) shows an arrangement of a hysteresis comparator which includes the resistors R5 and R6 and an operational amplifier, and FIG. 8(b) illustrate a waveform showing operation of the hysteresis comparator. In FIG. 8(a), Vr is a voltage supplied to the (+) terminal of the operational amplifier, and Vin is a voltage supplied to the (−) terminal of the same, Vout is output from the operational amplifier. In FIG. 8(b), a. horizontal axis shows a Vin, and a vertical axis shows Vout.

An upper limit voltage VH of Vin and a lower limit voltage VL are shown by the following equations:

$$VH = R5/(R5+R6) \times (VoutH - Vr) + Vr \tag{1}$$

$$VL = R5/(R5+R6) \times (VoutL - Vr) + Vr \tag{2}$$

As the above equations, setting of the resistors R5 and R6 can determine the upper limit voltage VH and the lower limit voltage VL.

As the arrangement shown in FIG. 4, application of the hysteresis comparator to the second reset circuit 22 which directly detects the REGIN voltage as power source voltage can effectively correspond to a minutely changed power source voltage.

That is, as shown in FIG. 8(b), in the hysteresis comparator, when the Vin increases, the output voltage is changed from VoutH to VoutL at the upper limit voltage VH. On the other hand, when the Vin decreases, the output voltage is changed from VoutL to VoutH at the lower limit voltage VL. In other words, when the REGIN voltage increases, the RST2 signal changes from "H" to "L" at the point that the REGIN voltage corresponds to the upper limit voltage VH. On the other hand, when the REGIN voltage decreases because of reasons such as the occurrence of an excessive current, the RST2 signal does not change until the REGIN voltage corresponds to the lower limit voltage VL.

Figure 9:
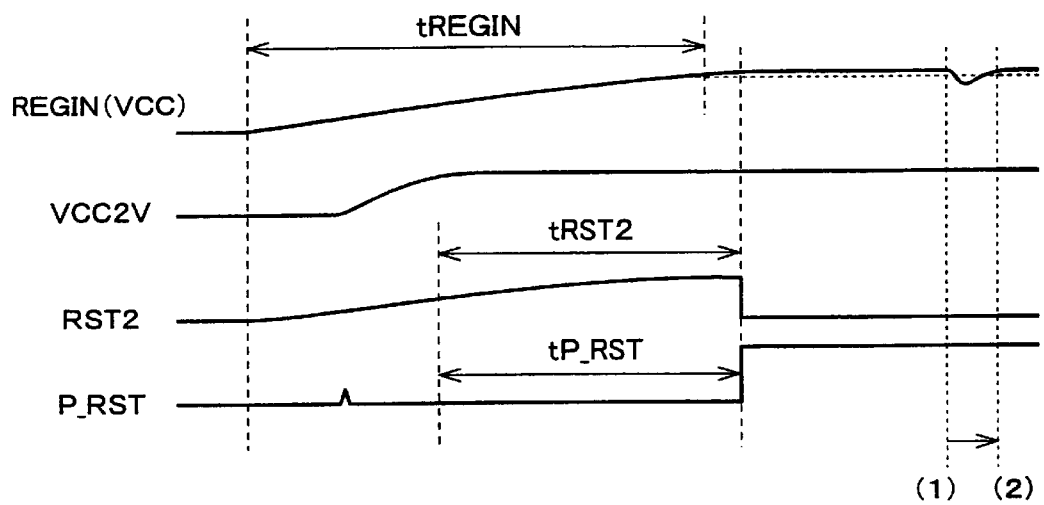
FIG. 9 is a block diagram of waveforms showing operation of each signal in case of the second reset circuit 22 arranged as shown in FIG. 4.
Figure 10:
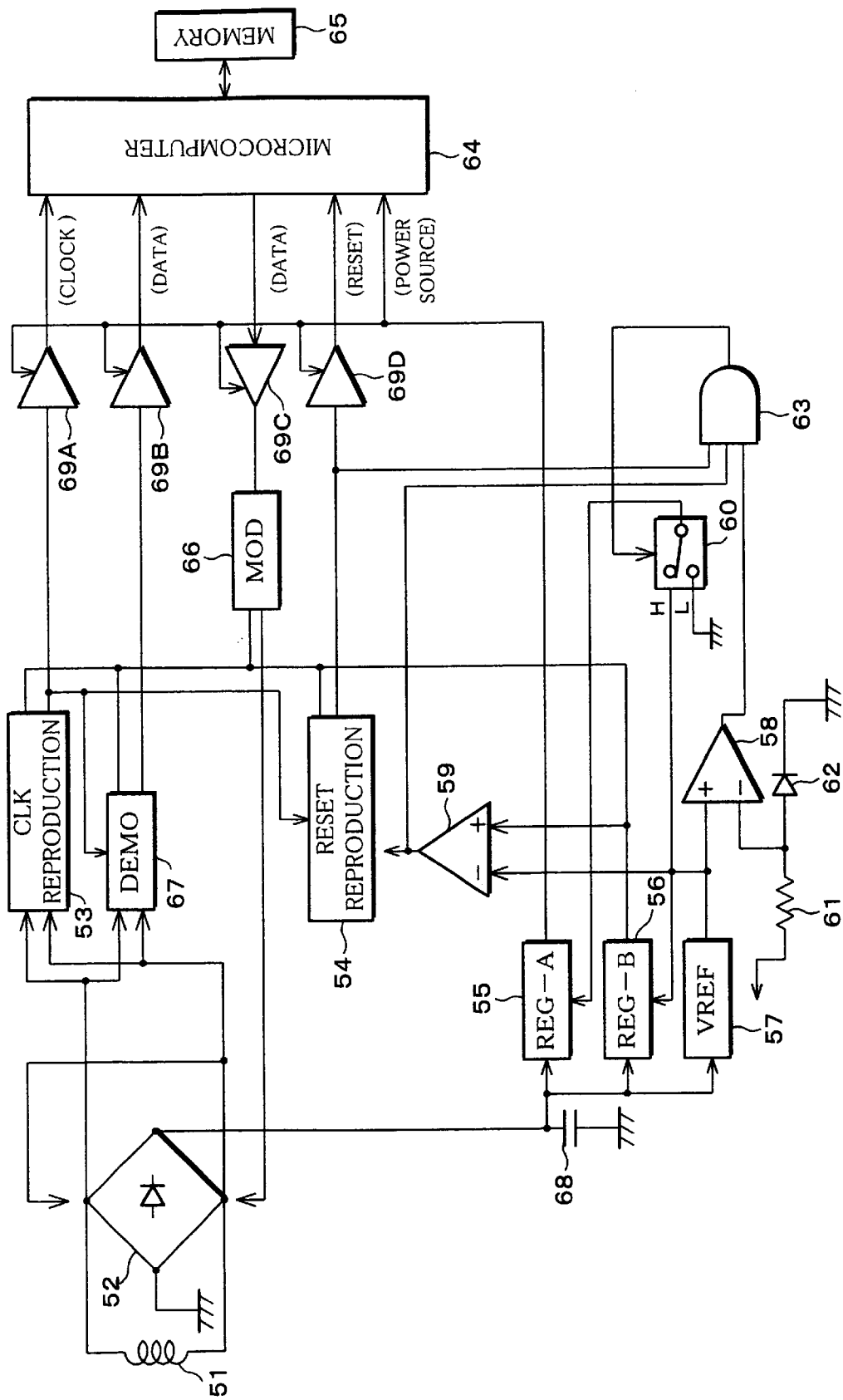
FIG. 10 is a block diagram schematically showing an arrangement of the conventional semiconductor circuit device.

FIG. 9 illustrates waveforms showing operation of each signal in case of the second reset circuit 22 arranged as shown in FIG. 4. Note that, FIG. 9 shows an example of operations by the reset circuit in case where excessive current occurs inside the semiconductor circuit device. In FIG. 9, it is assumed that excessive current occurs at the time period between (1) and (2), whereby the value of REGIN voltage decreases.

Here, it is assumed that voltage of 4.0 V is a detection level of the rising of the REGIN voltage. When the REGIN voltage goes down below 4.0 V, there occurs malfunction that the RST2 signal changes from "L" to "H" in the second reset circuit 22 shown in FIG. 3.

In contrast, in case of the second reset circuit 22 shown in FIG. 4, provision of the hysteresis to the input section of the operational amplifier can absorb the variation of the REGIN voltage, so that it is possible to prevent the malfunction of the power-on reset circuit 18.

According to such an arrangement, it is possible to prevent the malfunction of the reset circuit along with decrease in the power supply voltage due to the consumption of a large amount of current, which allows the nonvolatile memory having a large capacity, which consumes a large amount of current, to be mounted in the semiconductor circuit device. This makes it possible to realize a multi-purpose IC card which stores a plurality of applications.

In the present embodiment, explained is a semiconductor circuit device for carrying out a RF power supply to the non-contact type IC card. However, any systems in which carries out the RF power supply other than the IC card can be applied to the present invention. Further, non-contact tag system in which information is exchanged with a tag attached to a baggage without contacting.

As described above, a power-on reset circuit according to the present invention, provided in a system in which a power voltage is obtained from an external power supply source without contacting by electromagnetic induction, a power voltage thus obtained is converted into a predetermined voltage and supplied to a logic section which performs a logic operation, produces a reset signal for controlling a reset state of the system. The power-on reset circuit includes:

a first reset circuit for detecting a voltage supplied to the logic section so as to produce a first reset signal;

a second reset circuit for detecting an output voltage of a rectifying circuit which rectifies a power voltage thus obtained from the external power supply source so as to produce a second reset signal; and a reset signal outputting circuit for outputting as the reset signal either the first reset signal or the second reset signal.

Further, the power-on reset circuit according to the present invention can be arranged so that the first reset circuit includes a comparator circuit for comparing the voltage supplied to the logic section and a reference voltage which is used in a regulator circuit for converting the output voltage of the rectifying circuit which rectifies the power voltage into a predetermined voltage, and produces the first reset signal in response to the comparator circuit.

According to the above arrangement, the first reset signal is produced in accordance with the result of the comparison between the reference voltage used in the regulator circuit and the voltage supplied to the logic section. The reference voltage, which rises at the timing substantially same as that of the output voltage of the rectifying circuit, rises faster than the voltage supplied to the logic section. Therefore, according to the comparison between both voltages completely rising by an appropriate adjustment, the reference voltage is higher when the voltage supplied to the logic section does not rise. At the point that the voltage supplied to the logic section sufficiently rises, the voltage supplied to the logic section is higher. That is, according to the above arrangement, the rising of the voltage supplied to the logic section can be accurately detected by the relatively simple arrangement.

Further, in the above arrangement, the power-on reset circuit according to the present invention can be arranged so that the voltage supplied to the logic section is supplied to the comparator circuit via a delay circuit.

According to the above arrangement, the rising of the voltage supplied to the logic section is inputted to the comparator circuit after a delay by the delay circuit. That is, the rising of the voltage supplied to the logic section is detected after the delay time by the delay circuit from the actual rising. Therefore, setting the delay time so as to obtain the time required for system initialization can prevent malfunction in activating the system. Note that, the time required for system initialization is equivalent to the time period from the activation of the reset signal to the initialization of each peripheral block.

Further, in the above arrangement, the power-on reset circuit according to the present invention can be arranged so that the second reset circuit includes a comparator circuit for comparing the output voltage of the rectifying circuit and a reference voltage which is used in a regulator circuit for converting into a predetermined voltage the output voltage of the rectifying circuit which rectifies the power voltage, and produces the second reset signal in response to the comparator circuit.

According to the above arrangement, the second reset signal is produced in accordance with the result of the comparison between the reference voltage used in the regulator circuit and the output voltage of the rectifying circuit. The reference voltage rises at the timing substantially same as that of the output voltage of the rectifying circuit. Further, when the reference voltage completely rises, it is lower than the output voltage of the rectifying circuit. Therefore, according to the comparison between both voltages completely rising by an appropriate adjustment, the reference voltage is higher when the output voltage of the rectifying circuit does not rise. At the point that the output voltage of the rectifying circuit sufficiently rises, the output voltage of the rectifying circuit is higher. That is, according to the above arrangement, the rising of the output voltage of the rectifying circuit can be accurately detected by the relatively simple arrangement.

Further, in the above arrangement, the power-on reset circuit according to the present invention can be arranged so that the output voltage of the rectifying circuit is supplied to the comparator circuit via a delay circuit.

According to the above arrangement, the rising of the output voltage of the rectifying circuit is inputted to the comparator circuit after a delay by the delay circuit. That is, the rising of the output voltage of the rectifying circuit is detected after the delay time by the delay circuit from the actual rising. Therefore, setting the delay time so as to obtain the time required for system initialization can prevent malfunction in activating the system.

Further, in the above arrangement, the power-on reset circuit according to the present invention can be arranged so that the reset signal outputting circuit outputs the reset signal for releasing the reset state of the system when both the first and second reset signals become signals for releasing the reset state.

According to the above arrangement, when the power supply voltage rises sharply, the timing of the second reset signal becoming a signal for releasing the reset state is faster than that of the first resent signal becoming the same. Accordingly, a reset signal for releasing the reset state of the system is based on the first reset signal. That is, the reset release of the system is carried out in accordance with the first reset signal from the first reset circuit which surely carries out the reset release in case of a sharply rising power supply voltage.

On the other hand, when the power supply voltage rises gradually, the timing of the first reset signal becoming a signal for releasing the reset state is faster than that of the second resent signal becoming the same. Accordingly, a reset signal for releasing the reset state of the system is based on the second reset signal. That is, the reset release of the system is carried out in accordance with the second reset signal from the second reset circuit which surely carries out the reset release in case of a gradually rising power supply voltage.

That is, according to the above arrangement, it is possible to provide the power-on reset circuit which can surely control the reset state of the system in both cases of a sharply rising power supply voltage and a gradually rising power supply voltage.

Further, in the above arrangement, the power-on reset circuit according to the present invention can be arranged so that the second reset circuit has a hysteresis characteristic with respect to variation in the output voltage of the rectifying circuit.

According to the arrangement, the second reset circuit can change the production of the second reset signal in accordance with the variation of the output voltage of the rectifying circuit. For example, the second reset circuit surely keeps the reset state when the power supply voltage rises. On the other hand, it is possible to prevent an unnecessary reset from being carried out when the output voltage of the rectifying circuit temporarily decreases due to a temporary increase in a consumed current by writing and erasing operations in a memory having a large capacity.

More specifically, in case where the power supply voltage rises, the variation of the output voltage of the rectifying circuit is in the upward direction. In such a case, the hysteresis characteristic is set so that the second reset signal which releases the reset state is outputted at the point that the output voltage of the rectifying circuit completely rises. On the other hand, the variation of the output voltage of the rectifying circuit is in the downward direction when the output voltage of the rectifying circuit temporarily decreases due to a temporary increase in a consumed current in a state of the power supply voltage completely rising and being supplied in a steady manner. In such a case, the hysteresis characteristic is set so that certain level of decrease in voltage cannot cause the shift to the reset state.

Thus, according to the above arrangement, it is possible to prevent malfunction of reset operation along with decrease in the power supply voltage, which is caused by a large amount of consumed current, so that it is possible to establish a system in which mounted is a large-capacity of nonvolatile memory which consumes such a large amount of current.

Further, in the above arrangement, the power-on reset circuit according to the present invention can be arranged so that the system performs a contact-type power supply from the external power supply source, the reset signal outputting circuit outputs as the reset signal one of the first reset signal, the second reset signal, and a third reset signal supplied along with the contact-type power supply.

The above arrangement has a system in which non-contact and contact power supplies are carried out. The reset signal outputting circuit can output a reset signal in accordance with the third reset signal inputted along with contact-type power supply, in addition to the first and second reset signals. This makes it possible to provide the power-on reset circuit which can surely control the reset state of the system in either case of non-contact or contact power supply.

Further, in the above arrangement, the power-on reset circuit according to the present invention can be arranged so that the reset signal outputting circuit gives top priority outputting of the third reset signal as the reset signal when the third reset signal is supplied.

According to the above arrangement, in case of a contact type power supply, reset operation is carried out in response to the third reset signal, so that it is possible to surely carry out the reset operation corresponding to a contact type power supply without effects by peripheral electromagnetic waves.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A power-on reset circuit, provided in a system in which a power voltage is obtained from an external power supply source without contacting by electromagnetic induction, a power voltage thus obtained is converted into a predetermined voltage and supplied to a logic section which performs a logic operation, which produces a reset signal for controlling a reset state of the system, the power-on reset circuit, comprising:
    a first reset circuit for detecting a voltage supplied to the logic section so as to produce a first reset signal;
    a second reset circuit for detecting an output voltage of a rectifying circuit which rectifies a power voltage thus obtained from the external power supply source so as to produce a second reset signal; and
    a reset signal outputting circuit for outputting as the reset signal either the first reset signal or the second reset signal.

2. The power-on reset circuit according to claim 1, wherein the first reset circuit includes a comparator circuit for comparing the voltage supplied to the logic section and a reference voltage which is used in a regulator circuit for converting the output voltage of the rectifying circuit which rectifies the power voltage into a predetermined voltage, and produces the first reset signal in response to the comparator circuit.

3. The power-on reset circuit according to claim 2, wherein the voltage supplied to the logic section is supplied to the comparator circuit via a delay circuit.

4. The power-on reset circuit according to claim 3, wherein the delay circuit includes a resistor and a capacitor.

5. The power-on reset circuit according to claim 1, wherein the second reset circuit includes a comparator circuit for comparing the output voltage of the rectifying circuit and a reference voltage which is used in a regulator circuit for converting into a predetermined voltage the output voltage of the rectifying circuit which rectifies the power voltage, and produces the second reset signal in response to the comparator circuit.

6. The power-on reset circuit according to claim 5, wherein the output voltage of the rectifying circuit is supplied to the comparator circuit via a delay circuit.

7. The power-on reset circuit according to claim 6, wherein the delay circuit includes a resistor and a capacitor.

8. The power-on reset circuit according to claim 1, wherein the reset signal outputting circuit outputs the reset signal for releasing the reset state of the system when both the first and second reset signals become signals for releasing the reset state.

9. The power-on reset circuit according to claim 8, wherein the reset signal outputting circuit conducts a logical NOR operation with respect to the first and second reset signals so as to output the reset signal.

10. The power-on reset circuit according to claim 1, wherein the second reset circuit has a hysteresis characteristic with respect to variation in the output voltage of the rectifying circuit.

11. The power-on reset circuit according to claim 1, wherein the system also performs a contact-type power supply from the external power supply source, the reset signal outputting circuit outputs as the reset signal one of the first reset signal, the second reset signal, and a third reset signal supplied along with the contact-type power supply.

12. The power-on reset circuit according to claim 11, wherein the reset signal outputting circuit gives top priority outputting of the third reset signal as the reset signal when the third reset signal is supplied.

13. An IC apparatus, comprising:
   (a) a power source obtaining section for obtaining a power voltage from an external power supply source without contacting by electromagnetic induction;
   (b) a voltage control circuit for converting a power voltage thus obtained from the power source obtaining section into a predetermined voltage;
   (c) a logic section for being supplied voltage from the voltage control circuit and for conducting a logical operation; and
   (d) a power-on reset circuit for producing a reset signal for controlling a reset state of the logic section,
   wherein the power-on reset circuit includes:
      a first reset circuit for detecting a voltage supplied to the logic section so as to produce a first reset signal;
      a second reset circuit for detecting an output voltage of a rectifying circuit which rectifies a power voltage thus obtained from the external power supply source so as to produce a second reset signal; and
      a reset signal outputting circuit for outputting as the reset signal either the first reset signal or the second reset signal.

14. The IC apparatus according to claim 13, further comprising a nonvolatile memory to and from which the logic section can write and read information.

15. The IC apparatus according to claim 13, wherein the power source obtaining section demodulates data superposed by electromagnetic waves transmitted from the external power supply source, and modulates data transmitted from the logic section to transmit electromagnetic waves toward outside.

16. The IC apparatus according to claim 13, wherein the power source obtaining section extracts a clock signal superposed by electromagnetic waves transmitted from the external power supply source, and transmits a clock signal thus extracted to the logic section.

17. The IC apparatus according to claim 13, wherein the power source obtaining section, the voltage control circuit, the logic section, and the power-on reset circuit are included inside a card object.

18. The IC apparatus according to claim 13, wherein the power source obtaining section is also arranged so as to perform a contact-type power supply from the external power supply source.

* * * * *